(12) United States Patent
Pontius

(10) Patent No.: US 6,337,893 B1
(45) Date of Patent: Jan. 8, 2002

(54) NON-POWER-OF-TWO GREY-CODE COUNTER SYSTEM HAVING BINARY INCREMENTER WITH COUNTS DISTRIBUTED WITH BILATERAL SYMMETRY

(75) Inventor: Timothy A. Pontius, Lake in the Hills, IL (US)

(73) Assignee: Philips Electronics North America Corp., New York, NY (US)

(*) Notice: Subject to any disclaimer, the term of this patent is extended or adjusted under 35 U.S.C. 154(b) by 0 days.

(21) Appl. No.: 09/644,348

(22) Filed: Aug. 23, 2000

Related U.S. Application Data

(63) Continuation-in-part of application No. 09/434,218, filed on Nov. 4, 1999.

(51) Int. Cl.[7] .............................................. H03K 23/64
(52) U.S. Cl. ............................ 377/108; 377/26; 377/34
(58) Field of Search ............................. 377/26, 34, 108

(56) References Cited

U.S. PATENT DOCUMENTS

| | | | | |
|---|---|---|---|---|
| 4,780,894 A | * | 10/1988 | Watkins et al. ............... | 377/34 |
| 5,045,854 A | * | 9/1991 | Windmiller ................... | 377/34 |
| 5,084,841 A | * | 1/1992 | Williams et al. .............. | 377/34 |
| 5,220,586 A | * | 6/1993 | Tai ............................... | 377/34 |
| 5,355,396 A | * | 10/1994 | Tai ............................... | 377/34 |
| 5,754,614 A | | 5/1998 | Wingen ........................ | 377/34 |
| 5,923,718 A | * | 7/1999 | Takahashi et al. ............. | 377/34 |

* cited by examiner

Primary Examiner—Margaret R. Wambach
(74) Attorney, Agent, or Firm—Peter Zawilski

(57) ABSTRACT

A gray-code counter system (AP1) for a RAM-based FIFO comprises a read pointer (10), a write pointer (20), and a detector (30).

The read pointer includes a gray-code decoder (11), a binary incrementer (12), a gray-code encoder (13), and a register (14) that holds the pointer count). The binary incrementer increments by 1 except when the input is 0110 (decimal 6) or 1110 (decimal 14); in these cases, it increments by 3. The result is a 4-bit modulo-12 gray-code sequence with the twelve allowed gray-code values being distributed among the sixteen possible 4-bit gray code values with translational and reflective bilateral symmetry. The write pointer is similar. Because of the translational symmetry, detectors that work with counters with modulo numbers that are power of two work with the corresponding non-power-of-two counter to provide "full" and "empty" indications. When read and write counts differ at the two most-significant bit positions but are equal at the remaining bit positions, the detector provides a "full" indication for a 6-count FIFO.

The gray-code counter design is scaleable to any non-power-of-two modulo number divisible by four.

10 Claims, 2 Drawing Sheets

NON-POWER-OF-TWO GREY-CODE COUNTER SYSTEM HAVING BINARY INCREMENTER WITH COUNTS DISTRIBUTED WITH BILATERAL SYMMETRY

This is a continuation-in-part of copending U.S. patent application Ser. No. 09/434,218. filed Nov. 4, 1999.

BACKGROUND OF THE INVENTION

The present invention relates to computers and, more particularly, to computer communications-interface devices. A major objective of the invention is to provide for FIFO systems that permit simple detection of "full" and "empty" conditions when using read and write pointers with modulo numbers that are not powers of two.

Much of modern progress is associated with advances in computer technology. As computers have become more powerful, they have been required to communicate increasingly with peripherals and other computers. Buffering can facilitate asynchronous communications and thus obviate a need for communicating devices to share a common time base. In addition, buffering computer communications allows a host computer to attend to other tasks on a time-multiplexed basis during a communications session.

Buffering is commonly accomplished using RAM-based FIFOs, a first-in-first-out (FIFO) device in which data being communicated is temporarily stored in random-access memory (RAM). When a suitable unit, e.g., byte, of data is received by the FIFO, the data unit is stored at a FIFO address indicated by a write pointer. Once that data is stored, the write pointer is incremented to the next address—which is where the next unit of data received will be stored. When a device is ready to read from the FIFO, it reads from a FIFO address indicated by a read pointer. After the data is read, the read pointer is incremented so that the next read is from the next FIFO address. Each pointer is basically a counter that counts data transfers. The counters are modulo in that they wrap to zero when a maximum count is reached.

Reading from a FIFO is typically stopped when the FIFO is empty and writing to the FIFO is typically stopped when the FIFO is full. In some FIFO systems, the read and write pointers have modulo numbers twice the FIFO depth. In such a case, "empty" is indicated when the pointers are equal, and "full" is indicated when the difference between the pointers is the FIFO depth, which is half the pointer modulo number. In binary counters are used, the FIFO is either full or empty when all the bits except the most significant bit are equal; the most significant bit distinguishes between full and empty. The following pairs of 3-bit modulo-8 binary values (with decimal equivalents) indicate a "full" FIFO with four storage locations: 000 (0), 100 (4); 001 (1), 101 (5); 010 (2), 110 (6); and 011 (3), 111 (7).

Conventional binary-code counters can be used as FIFO pointers. Binary counter design has matured to the point where, once a few specifications (such as target modulo number) are entered, a computer can yield an optimized counter design. A disadvantage of binary counters is that there can be considerable ambiguity when a count is read during a count transition. For example, when a count increments from 011=3 to 100=4, every bit value changes. However, the changes can take place at slightly different times across the bit positions. Any of eight possible 3-bit binary values might be read during this transition. Attempts to design around such extreme ambiguities can add considerable complexity to the counter or to circuit elements that respond to the counter.

An alternative to binary code called "gray code" requires a change in only one bit position in the event of a unit increment. The following is a 3-bit gray code sequence: 0=000, 1=001, 2=011, 3=010, 4=110, 5=111, 6=101, 7=100. Incrementing the last value, 100, yields the first value 000. Since only one bit position changes during a unit increment, the only possible reads during a transition are the value being changed from and the value being changed to. It is much easier to design around this limited ambiguity than it is to design around the much more extensive ambiguities confronting binary counter reads. Gray codes can readily be constructed for any bit length. A one-bit gray code can be the same as a one-bit binary code. The sequence is 0,1. A two-bit gray code can be derived from a one-bit gray code by the following three-step algorithm. First, the sequence is copied to yield 0,1;0,1. Second, the replica is reversed to yield 0,1;1,0. Third, leading zeroes are added to the values in the original and leading ones are added to the reversed values of the inverted replica to yield 00, 01, 11, 10. This is a two-bit gray code. The three-step algorithm can be applied to the two-bit gray-code to yield the three-bit gray code described above. The algorithm can be iterated to yield gray codes of any desired bit length.

Despite representing an alternative encoding scheme for umbers, gray code shares with binary code the characteristic that counts one-half the power-of-two counter modulus apart are readily determined. If two counts differ at and only at both of their two most-significant bits, they are spaced apart by one-half the counter modulo number of counts apart. For example, two 3-bit modulo-8 gray-code counts are four counts apart when they are the same in their least-significant bit and different in the two most-significant bits. The "full" gray-code pairs (with decimal equivalents) are 000 (0), 110 (4); 001 (1), 111 (5), 011 (2), 101 (6), 010 (3), 100 (7). Thus, read and write counters based on power-of-two gray-code counters provide facile detection of full and empty FIFO conditions.

A problem with many gray-code counter designs is that they tend to be complex and are not readily scaled. These problems are addressed by a gray-code design disclosed by Wingen in U.S. Pat. No. 5,754,614. Wingen's gray-code counter comprises a count register for storing a gray-code count, a gray-code decoder for converting the stored gray-code count to a corresponding binary-code value, a binary-code incrementer for incrementing the binary-code value, and a gray-code encoder for converting the incremented binary-code value to the corresponding gray-code count.

A disadvantage of the Wingen gray-code counter as well as other gray-code counters (e.g., those referenced in the Wingen patent) is that, when the target FIFO depth is not a power of two, the FIFO design has excess capacity. For example, when a communication application only requires a FIFO depth of 78, the power-of-two limitation requires the use of an 128-address FIFO. In contrast, binary-code counters can be designed for any positive-integer depth. The discrepancy between target and gray-code-imposed capacities can be much greater for larger FIFOs. The excess capacity can be costly in terms of integrated-circuit area that might otherwise be devoted to other functions. The incorporating integrated circuit can be less functional or more costly as a result.

Parent U.S. patent application Ser. No. 09/434,218 addresses excess capacity by disclosing a scaleable design for non-power-of-two even modulo gray-code counters. However, when the disclosed counters are one-half their modulo apart in their gray-code counts, the gray-code counts typically do not differ in any simple fashion. For example, in a 3-bit modulo 6 counter (Table I of U.S. application Ser. No. 09/434,218) the pairs that are three counts apart are: 000 (0), 010 (3); 001 (1), 110 (4); and 011 (2), 100 (5). Thus, it is not straightforward to determine when a FIFO is full when two such counters are used for the read and write pointers. What is needed is a scaleable non-power-of-two gray-code counter design that provides for simple determination of when two counts are half the counter modulo apart.

SUMMARY OF THE INVENTION

The present invention provides an n-bit modulo-M gray-code counter in which the distribution of M gray-codes among $N=2^{**}n$ possible n-bit gray codes has bilateral symmetry. Preferably, the symmetry is translational, but it can also be reflective or both. In a FIFO or other system having two such gray-code counters, detecting "full" conditions in which the counts are M/2 counts apart is readily achieved using either the gray-code count or binary-code equivalents.

A suitable gray code can be constructed for any selected modulo number that is divisible by four in the following manner. Start with a power-of-two gray code for the next larger power of two. For example, if ½N<M<N, select the full n-bit modulo-N gray code. Then omit (skip) (N–M)/4 gray codes at the beginning of the modulo-N gray-code sequence, (N–M)/2 gray codes in the middle of the modulo-N gray-code sequence, and (N–M)/4 gray codes at the end of the modulo-N gray-code sequence. The result is a modulo-M gray code sequence.

For example, a modulo-12 gray code can be constructed from a modulo-16 gray code as indicated: 0123456789ABCDEF, where the gray codes are presented by hexadecimal-code equivalents, and the twelve included codes are underlined. Note that any two underlined modulo-12 values that are six underlined modulo-12 counts apart are separated by exactly one skip over two non-underlined values of the corresponding modulo-16 system. Thus, any two counts separated by six counts in the modulo-12 system are separated by eight counts in the corresponding modulo-16 system. Thus, the modulo-12 system can use the same detection scheme as the corresponding modulo-16 system. More generally, any non-power-of-two modulo-M system with bilateral translational symmetry can use the same detector design for full indications as the corresponding power-of-two modulo-N system.

While the foregoing method can generate gray-codes for any target modulus number that is divisible by four, there are other methods that can generate alternative gray codes with the desired symmetry. For example, select M/4 consecutive gray-code values from a set of N/4 gray codes. Apply the gray-code expansion technique (copy, flip, add 0s and 1s) twice, and the result is a modulo-M code with bilateral translational and reflective symmetry. Alternatively, one can select the first (or last) M/2 consecutive gray codes from a set of N/2 gray codes, apply the gray-code expansion technique once, and achieve a gray code with bilateral reflective symmetry but not bilateral translational symmetry.

A gray-code counter can include a gray-code decoder, a binary incrementer, a gray-code encoder, and a count register. The gray-code decoder takes present gray-code counts and translates them to "present" binary-code values. The binary incrementer increments the present binary-code values to yield successor binary-code values. The binary incrementer is designed to "skip over" binary values that have no equivalents in the modulo-M gray code. In the hexadecimal notation example above, an incrementer would increment from 6 to 9 (skipping 7 and 8), and would increment from E to 1 (skipping F and 0). The gray-code encoder converts the successor binary-code values into successor gray-code counts. When the register is next clocked, the successor gray-code counts overwrite their predecessors and become the present gray-code counts for the next iteration.

FIFO "full" detections are readily obtained where the read and write pointers are counters with bilateral translational symmetric distributions. In fact, there is a choice of methods for determining a "full" condition. The simpler "full"-detection method involves comparing the gray-code counts. In that case, "full" is indicated when the read and write counts differ at and only at their two most-significant bits. The alternative "full"-detection method involves subtracting the binary-code equivalents of the gray-code counts. If the difference is N/2, i.e., half the modulo number for the corresponding power-of-two counter, the FIFO is full.

Thus, the present invention provides a scaleable non-power-of-two gray-code counter counter design with straightforward detection of FIFO "full" conditions. As explained above, the invention provides at least two convenient methods of making the "full" determinations. These and other features and advantages of the invention are apparent from the description below with reference to the following drawings.

DESCRIPTION OF THE PREFERRED EMBODIMENTS

Figure 1:
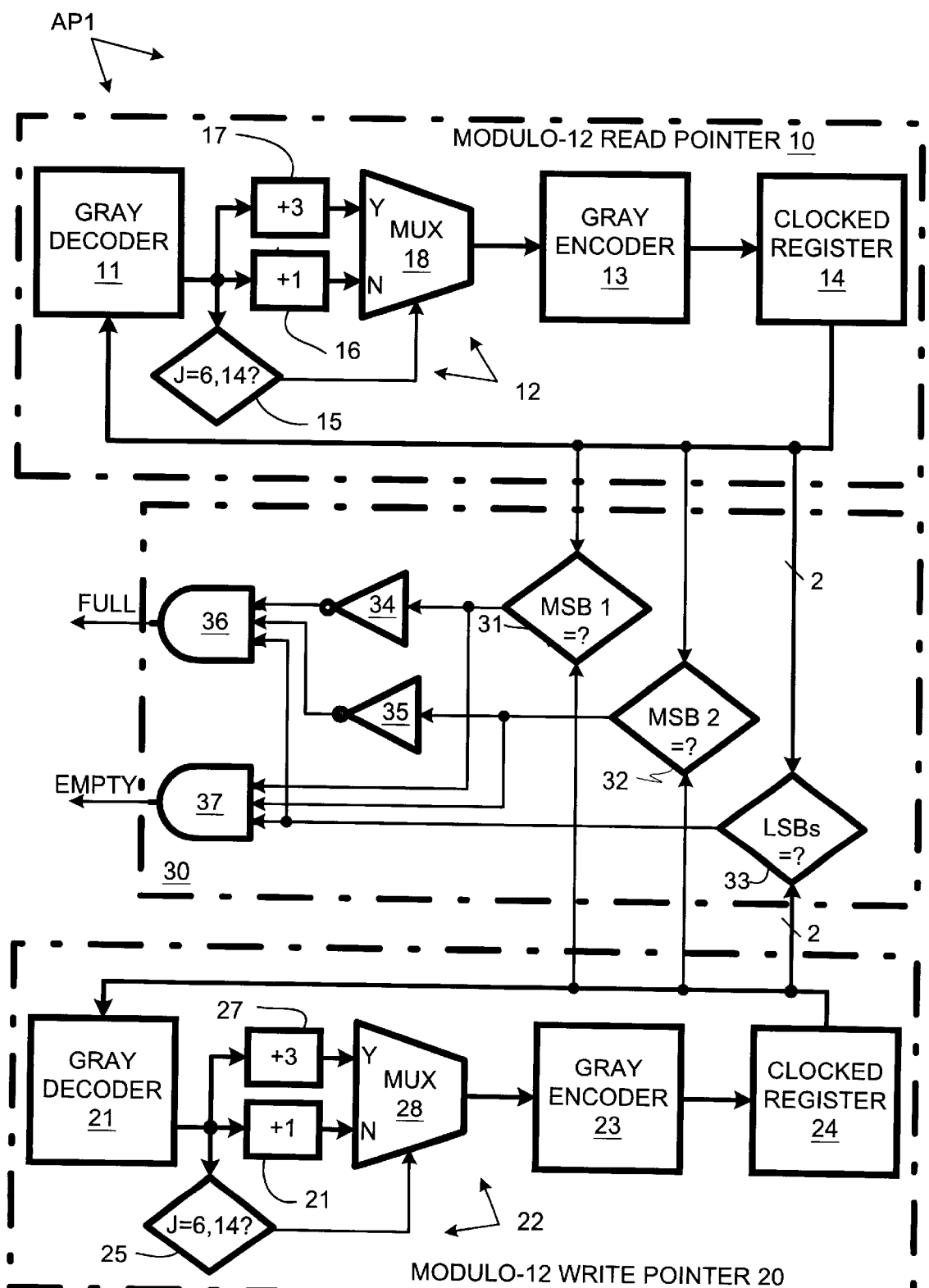
FIG. 1 is a logic diagram of a system with two modulo-12 gray-code counters in accordance with the present invention.

In accordance with the present invention, a pointer system AP1 for a RAM-based FIFO (not shown) includes a read pointer 10, a write pointer 20, and a full/empty detector 30. While in practical applications, larger capacities would be involved, for expository purposes, the FIFO has six storage locations, and pointers 10 and 20 are modulo-12. Detector 30 compares the counts for read pointer 10 and write pointer 20. When the counts are equal, detector 30 indicates that the FIFO is empty; when the counts differ by six, detector 30 indicates that the FIFO is full.

Write pointer 10 comprises a gray-code decoder 11, a binary incrementer 12, a gray-code encoder 13, and a clocked register 14.

Binary incrementer 12 includes a comparator 15, a "plus-1" incrementer 16, a "plus-3" incrementer 17, and a multiplexer 18. Read pointer 20 is essentially similar, including a gray-code decoder 21, a binary incrementer 22, a gray-code encoder 23, and a clocked register 24. Binary incrementer 22 includes a comparator 25, a "plus-1" incrementer 26, "plus-3" incrementer 27, and a multiplexer 28. Detector 30 comprises a most-significant bit comparator 31, a $2^{nd}$-most-significant bit comparator 32, a least-significant bits comparator 33, inverters 34 and 35, a "full" AND gate 36, and an "empty" AND gate 37.

During operation of read pointer 10, gray-code decoder 11 converts a "present" gray-code count to its equivalent binary-code value J. Binary incrementer 12 increments the present binary-code value J to yield a successor binary-code value K. Gray-code encoder 13 encodes successor binary-code value K into an equivalent successor gray-code count. The successor gray-code count replaces the present gray-code count in 4-bit register 14 when it is next clocked (e.g., in response to a read from the FIFO). The successor gray-code count is then considered the next present gray-code count that is fed back to gray-code decoder 11 to begin the next count iteration.

For most possible present binary-code values J, incrementer 12 increments by one (K=J+1). However, when the present binary-code value is 0110 (6) or J=1110 (14), incrementer 12 increments by three (6+3=9 or 14+3=1). Comparator 15 monitors the present binary-code value output from gray-code decoder 11. If the present binary-code value does not equal 6 or 14, the output of comparator 15 is low and the N input of multiplexer 18 is selected. The N input is coupled to plus-1 incrementer 16, which always outputs J+1. When the N input is selected, the output of multiplexer 18 (and thus of binary incrementer 12) is K=J+1. When the present binary-code value is 6 or 14, comparator 15 outputs high, selecting the Y input of multiplexer 18. The Y input of multiplexer 18 is coupled to plus-3 incrementer 17, so when J=6,K=9, and when J=14,K=1.

In practice, incrementer 12 can be implemented using a three-input multiplexer, with one input coupled to a plus-1 incrementer, one input coupled to a constant value of 1001 (9), and one input coupled to a constant value of 0001 (1). When 1110 (14) is detected, the 0001 (1) input is selected, when 0110 (6) is detected, 1001 (9) is selected, and otherwise the plus-1 incrementer is selected. The following table represents the function of incrementer 12.

Incrementer Function for System AP1

| Decimal | Binary | Gray-code |
|---|---|---|
| (15) | (1111) | (1000) |
| 14 | 1110 | 1001 |
| 13 | 1101 | 1011 |
| 12 | 1100 | 1010 |
| 11 | 1011 | 1110 |
| 10 | 1010 | 1111 |
| 9 | 1001 | 1101 |
| (8) | (1000) | (1100) |
| (7) | (0111) | (0100) |
| 6 | 0110 | 0101 |
| 5 | 0101 | 0111 |
| 4 | 0100 | 0110 |
| 3 | 0011 | 0010 |
| 2 | 0010 | 0011 |
| 1 | 0001 | 0001 |
| (0) | (0000) | (0000) |

For incrementer 12, the successor binary-code value K is the first binary-code value not in parentheses above (with wrapping) the present binary-code value J. Thus, if J=0001 (1), then K=0010 (2).

For J=0110 (6), K=1001 (9). For J=1110 (14), K=0001 (1).

Consistent with its modulo-12 function, incrementer 12 uses twelve of sixteen possible 4-bit binary-code values. Note that the twelve modulo-12 binary-code values are distributed among the sixteen possible 4-bit binary-code values with bilateral translational symmetry. Using a hexadecimal representation, the distribution is 0123456789ABC-DEF. The two halves of the modulo-16 binary code, 01234567 and 89ABCDEF, have the same distribution of modulo-12 numbers. More specifically, the middle six of each group of eight modulo-16 numbers are used as modulo-12 numbers. Note that counters 10 and 20 also have bilateral reflective symmetry in that the distribution 01234567 is the same as for FEDCBA98.

The function of gray-code encoder 13 is determined from the table by moving from a value K in the center column to a gray-code count in the right column. Thus, 0101 (5) is encoded as 0111, while 1010 (10) is encoded as 1111. (The gray-code character of the sequence is preserved despite the two skips.) Note that the function of gray-code decoder 11 is determined from the table by selecting the binary-code value to the right of a given gray-code count.

As mentioned above, write pointer 20 is essentially similar to read pointer 10. Accordingly, the foregoing operational description of incrementer 12 applies as well to incrementer 22. Both pointers 10, 20, store modulo-12 gray-code counts in their respective registers 14, 24. The possible counts are those gray-code counts in the right column of the table that are not in parentheses. Of course, at any given moment, the counts of pointers 10 and 20 may be the same or different.

Detector 30 indicates when the FIFO is empty or full. To this end, most-significant-bit comparator 31, which can be an XNOR logic gate, compares the most-significant bit of the read-pointer count with the most-significant bit of the write-pointer count. $2^{nd}$-most significant bit comparator 32, which can also be an XNOR gate, compares the $2^{nd}$-most-significant bit of the read-pointer count with the $2^{nd}$-most significant bit of the write-pointer count. Least-significant bits comparator 33 compares the two least-significant bits of the counts. Comparator 33 can be implemented as two parallel XNOR gates followed by an AND gate. Generalizing for wider counts, for n-bit-wide counts, the number of least-significant bits compared is n-2.

When the read and write pointer counts are equal, all three inputs to "empty" AND gate 37 are high, so its output is high, providing the "empty" indication. When the read and write pointer counts are not equal, at least one of the inputs to AND gate 37 is low, so its output is low, indicating the FIFO is not empty. "Full" AND gate 36 receives the same input from LSB comparator 33 as does "empty" AND gate 37. However, the inputs to "full" AND gate 36 from MSB comparator 31 and from $2^{nd}$ MSB comparator 32 are inverted (relative to the corresponding inputs to "empty" AND gate 37) respectively by inverters 34 and 35. Therefore, the output of "full" AND gate 34 is high only when the two least-significant bits of the read and write pointer counts are equal but the two most-significant bits are different. Inspection of the table confirms that this condition is met when and only when the gray-code counts are six modulo-12 counts apart, which is the case when the 6-location FIFO is full.

The foregoing full/empty detector design can be readily scaled to any non-power-of-two modulo number that is divisible by four. In the general case. If the read and write counts are equal, the FIFO is empty. If the read and write counts differ at their two most-significant bit positions but are equal at all other bit positions, then the FIFO is full.

As an alternative to detector 30, a subtractor can be coupled to the decoder outputs to provide a difference between present binary-code values for the read and write pointers. If the difference is 0, the FIFO is empty. If the difference is N/2, the FIFO is full. Since it must wait until a gray-code is decoded, this detector design is slightly slower than the illustrated detector design. In addition, the subtractor is more complex than the XOR logic of detector 30. However, the subtractor-based detector makes it easier to detect selected intermediate levels: e.g., differences of 1 count for "almost empty" and differences of M−1 counts for "almost full".

Note that full is indicated when the binary difference is N/2 and not when the difference is M/2, which is the number of counts. In general, a modulo-M counter skips N−M modulo-N counts. When the modulo-M counts are distributed with bilateral translational symmetry, any two modulo-M counts that are M/2 modulo-M counts apart necessarily skip (N−M)/2 counts of the modulo N counter. Thus, (N−M)/2 must be added to the modulo-M difference to get the corresponding modulo-N difference. The modulo-M difference is M/2, so the modulo-N difference is M/2+(N−M)/2, which is N/2. In the illustrated modulo-12 system, the modulo-M (M=12) difference between binary (decimal) 0001 (1) and 1001 (9) is six counts (2,3,4,5,6,9), but the modulo-N (N=16) distance is eight counts (2,3,4,5, 6,7,8,9). This is why detectors suitable for power-of-two gray-code counters can be used for non-power-of-two counter with bilateral translational symmetry. The same detectors do not work with most other non-power-of-two gray-code counters.

Figure 2:
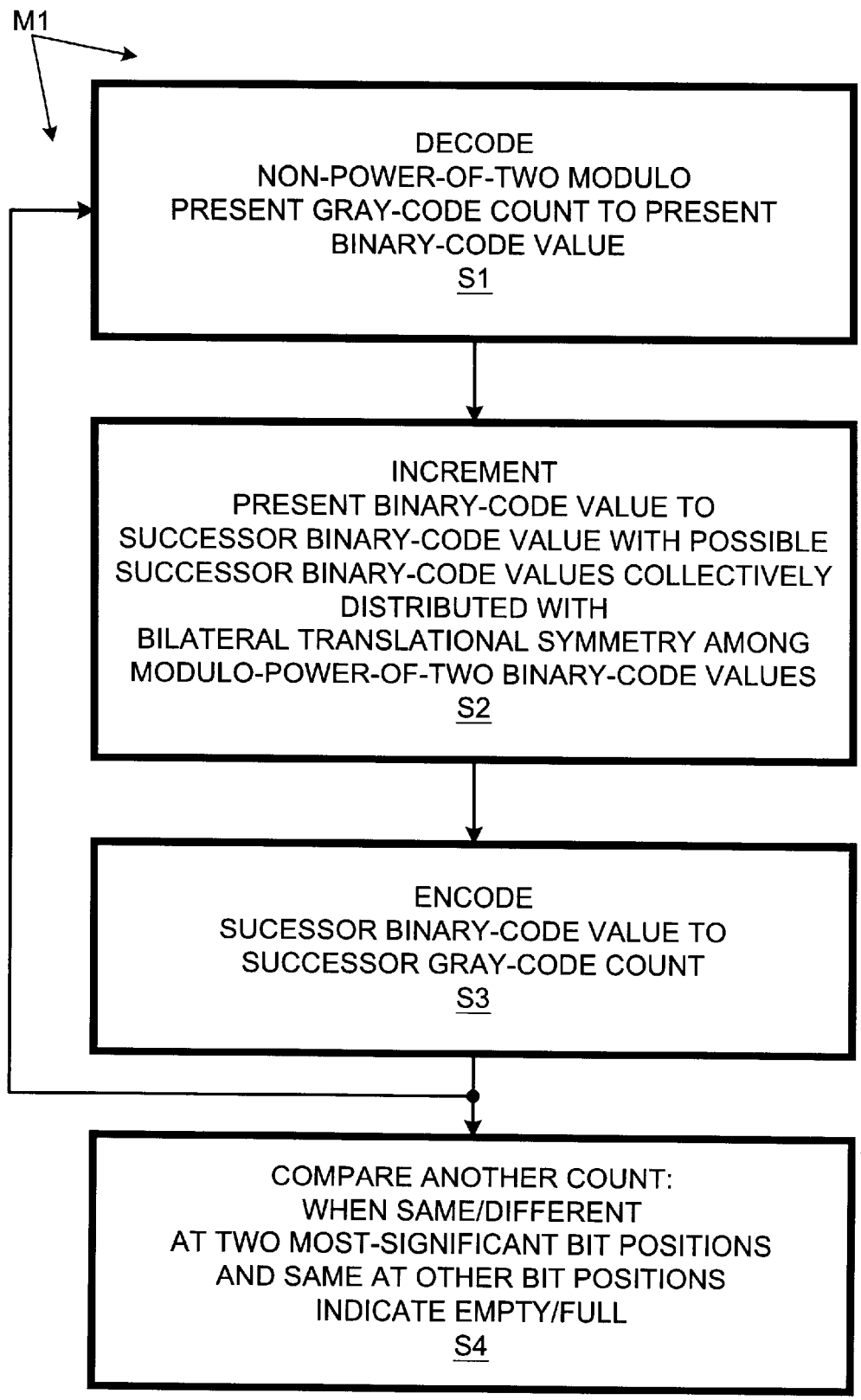
FIG. 2 is a flow chart of a method implemented by the system of FIG. 1 in accordance with the present invention.

A gray-code counting method M1 of the invention implemented in the context of system AP1 is flow charted in FIG. 2. At a first step S1, a present gray-code count is decoded to yield a present binary-code value. The gray-code is a non-power-of-two modulo number divisible by four.

At a second step S2, the present binary-code value is incremented to yield a successor binary-code value. The possible successor binary-code values are distributed with bilateral translational symmetry among possible binary-code values of the same bit length. For most possible present binary-code values, the increment is "plus 1". However, for two (or other even number) of the possible present binary-code values, the increment is by some greater odd number.

At step S3, the successor binary-code value is encoded to yield a successor gray-code count. Upon the next clock signal to the count register, the successor gray-code count becomes the present gray-code count, and method M1 returns to step S1.

In the meantime, empty and full detections can be made at step S4. If read and write counts are the same at every bit position, the counts are equal. If the read and write counts differ at both of the two most-significant bit positions, but not at any other bit position, then the FIFO is full.

The present invention provides for straightforward design of a gray-code counter for any modulo number M that is divisible by four but is not a power of two. The design method starts with the smallest power-of-two gray-code sequence larger than the desired gray-code sequence. In other words, if M is the target modulo, then ½N<M<N, where N is a power of two (N=2**n). N is necessarily sixteen or greater. Since M and N are both divisible by four, so is their difference N−M=P. To form the modulo-M sequence, skip the first P/4, the last P/4, and the middle P/2 of the modulo-N sequence.

A more general design method begins with selecting M/4 consecutive gray-codes from a modulo-N/4 gray-code sequence. For example, select the three underlined counts in 0123. Do a conventional gray-code expansion (copy, flip, add 1s and 0s) to yield 0123 4567. Note that the resulting modulo-M/2 sequence has reflective symmetry. Do the conventional gray-code expansion a second time to yield 0123 4567 89AB CDEF. This sequence, which is the one used in system AP1, has reflective symmetry because of the flip, but also has translational symmetry because of the double flip. If the starting point is, instead, 0123, the end result is 0123 4567 89AB CDEF, which has the desired properties.

The invention provides for another design method that begins with either the first (or last) M/2 values of a modulo-N/2 gray code. For example, where N=16 and M=12, 01234567 (or 01234567) can serve as a starting point. The conventional gray-code expansion technique is applied to yield 0123456789ABCDEF (or 0123456789ABCDEF). The result is a gray-code sequence with bilateral reflective symmetry but not bilateral translational symmetry.

Note that the modulo-M gray code values are modularly consecutive modulo-N values. One advantage of counters with only bilateral reflective symmetry is that some have only one skip, which simplifies the incrementer design. All counters of the invention with bilateral translational symmetry have at least two skips. Moreover, the modulus need not be divisible by four.

The present invention has wide applicability to fields involving asynchronous computer communications and other areas where RAM-based FIFOs are used. In general, the FIFO sizes are larger than those implied above, and the counter modulo numbers are correspondingly larger. These and other variations upon and modification to the described embodiments are provided for by the present invention, the scope of which is defined by the following claims.

What is claimed is:

1. A system comprising:
   a set of at least one modulo-M non-power-of-two gray-code counter, each gray-code counter including
   a gray-to-binary decoder for respectively converting present gray-code counts to present binary-code values,
   a binary-to-gray encoder for respectively encoding successor binary-code values to successor gray-code counts, and
   an n-bit binary incrementer for incrementing said present binary-code values to said successor binary values, each successor binary-code value being one greater than the respective present binary-code value for most possible present binary-code values, said binary incrementer providing M<N=2**n n-bit binary-code values as possible successor binary-code values, said possible successor binary-code values collectively having a distribution through the N possible n-bit binary values, said distribution having a bilateral symmetry, said binary incrementer being coupled to said gray-to-binary decoder for receiving said present binary-code value, said binary incrementer being coupled to said binary-to-gray encoder for providing said successor binary-code value thereto.

2. A system as recited in claim 1 wherein said bilateral symmetry is translational.

3. A system as recited in claim 2 wherein said set includes two modulo non-power-of-two gray-code counters respectively providing for first and second present gray-code counts, said system further comprising a detector that provides an indication when said first and second successor present gray-code counts are different in the two most-significant bit positions and the same in the remaining bit positions.

4. A system as recited in claim 2 wherein said set includes two modulo non-power-of-two gray-code counters respectively providing for first and second present gray-code counts so that first and second binary-code values are also provided, said system further comprising a detector that provides an indication when a difference between said first and second binary-code values equals M/2.

5. A system as recited in claim 1 wherein said distribution has bilateral reflective symmetry.

6. A method comprising the steps of:
   decoding a predecessor n-bit gray-code value to a present n-bit binary-code value;

incrementing said present n-bit binary-code value to provide a successor n-bit binary-code value,
> for most possible present modulo-M binary-code values, incrementing by 1 -modulo-N, where $N=2^{**}n$,
> for at least one possible present n-bit binary-code value, incrementing by more than 1 -modulo-N so that there are exactly M possible successor binary-code values, $\frac{1}{2}N<M<N$, said M possible successor binary-code values having a distribution, said distribution having a bilateral symmetry; and encoding said successor binary-code value to a successor gray-code value.

7. A method as recited in claim 6 wherein said bilateral symmetry is translational.

8. A method as recited in claim 7 wherein said decoding, incrementing, and encoding steps provide first and second successor gray-code counts, said method further comprising a step of indicating when said first and second successor gray-code counts are different at their two most-significant bit positions and the same at other bit positions.

9. A method as recited in claim 6 wherein said decoding, incrementing, and encoding steps provide first and second successor gray-code counts, said method further comprising a step of indicating when a difference between said first present binary-code value and said second binary-code value equals M/2.

10. A method as recited in claim 6 wherein said distribution has bilateral reflective symmetry.

* * * * *